United States Patent [19]
Noguchi et al.

[11] Patent Number: 5,401,336
[45] Date of Patent: Mar. 28, 1995

[54] PHOTOVOLTAIC DEVICE

[75] Inventors: Shigeru Noguchi, Hirakata; Hiroshi Iwata, Neyagawa; Keiichi Sano, Moriguchi, all of Japan

[73] Assignee: Sanyo Electric Co., Ltd., Moriguchi, Japan

[21] Appl. No.: 151,254

[22] Filed: Nov. 12, 1993

[30] Foreign Application Priority Data

Dec. 9, 1992 [JP] Japan ................... 4-329264

[51] Int. Cl.⁶ .............................. H01L 31/078
[52] U.S. Cl. ......................... 136/255; 136/256; 136/258; 136/261; 257/431; 257/458; 257/465
[58] Field of Search ............... 136/255, 256, 258 PC, 136/258 AM, 261; 257/53, 184, 431, 458, 465

[56] References Cited

U.S. PATENT DOCUMENTS

| | | | |
|---|---|---|---|
| 4,620,058 | 10/1986 | Winterling et al. | 136/258 |
| 4,633,033 | 12/1986 | Nath et al. | 136/256 |
| 4,725,559 | 2/1988 | Fraas | 437/5 |
| 5,112,409 | 5/1992 | Warfield et al. | 136/256 |
| 5,213,628 | 5/1993 | Noguchi et al. | 136/255 |

FOREIGN PATENT DOCUMENTS 4-130671  5/1992  Japan.
4-199750  7/1992  Japan.

OTHER PUBLICATIONS

C. Hu et al., *Solid State Electronics, vol. 20, pp. 119–123 (1977)*.

Thin Crystalline Silicon 100 mm × 100 mm MIS-Inversion Layer Solar Cells with Bifacial Sensitivity, K. Jaeger et al., 11th EC-PVSEC (1992) pp. 168–171.

24% Efficient Silicon Solar Cells, A. Wang et al., Appl. Phys. Lett. vol. 57(6), Aug. 6, 1990, pp. 602–604.

*Primary Examiner*—Aaron Weisstuch
*Attorney, Agent, or Firm*—W. G. Fasse; W. F. Fasse

[57] ABSTRACT

A photovoltaic device includes an i-type amorphous silicon thin film and a p-type amorphous silicon thin film arranged on portions of an n-type crystalline silicon substrate, a collecting electrode arranged on the amorphous silicon thin film, and an insulating layer arranged around the portions where the amorphous silicon thin film is formed. Thus, a pin junction is formed only below the collecting electrode.

13 Claims, 7 Drawing Sheets

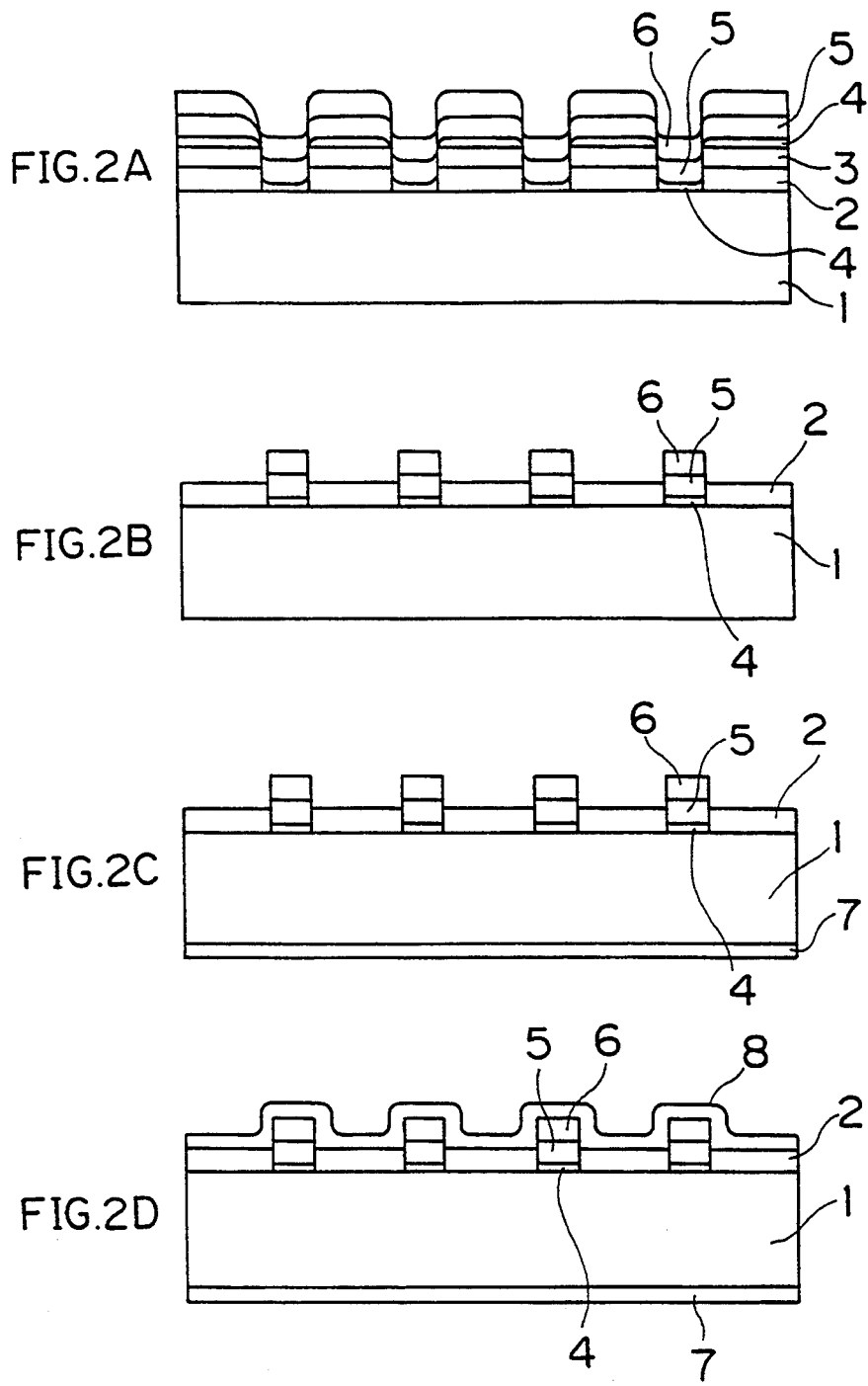

PHOTOVOLTAIC DEVICE

BACKGROUND OF THE INVENTION

1. Field of the Invention

The present invention relates generally to a photovoltaic device, and more particularly, to a photovoltaic device having a heterojunction formed by combining a crystalline semiconductor and an amorphous semiconductor.

2. BACKGROUND INFORMATION

In recent years, solar cells using polycrystalline silicon have been extensively studied as photovoltaic devices. Of the solar cells, a solar cell having a heterojunction formed by combining amorphous silicon and polycrystalline silicon has, received attention because it is low in cost and high in conversion efficiency.

In the above described solar cell having the heterojunction, a large number of interfacial states may often be formed in the vicinity of the junction interface of amorphous silicon and crystalline silicon. Therefore, even if light is incident on the junction to generate a large number of carriers, the carriers disappear at recombination centers due to the above described interfacial states, resulting in a reduced conversion efficiency.

In order to decrease the number of interfacial states in the vicinity of the heterojunction interface to improve junction characteristics, a photovoltaic device having an intrinsic amorphous semiconductor layer disposed in the heterojunction interface has been proposed, in Japanese Patent Laying-Open Nos. 4-130671 (1992) and 4-199750 (1992).

However, the structure having the intrinsic amorphous semiconductor layer in the heterojunction interface is not different from the structure without the intrinsic amorphous layer, in that semiconductors, having different forbidden band widths in the vicinity of the junction interface are coupled to each other. Consequently, energy barriers against photo-generated carriers still exist, so that the collection efficiency of the carriers is still insufficient.

Furthermore, the amorphous semiconductor layer is relatively high in electrical resistance, thereby making it difficult for the carriers to move smoothly moved in the amorphous semiconductor layer. As a result, the loss at the interface of the crystalline semiconductor and the amorphous semiconductor cannot be ignored.

SUMMARY OF THE INVENTION

An object of the present invention is to provide a photovoltaic device having a structure in which the recombination of photo-generated carriers can be effectively prevented, the carriers can be effectively collected and consequently, the conversion efficiency can be further increased.

In accordance with a broad aspect of the present invention, a photovoltaic device comprises a crystalline semiconductor layer of one conductivity type, an amorphous semiconductor layer of the other conductivity type formed directly or indirectly on portions of the crystalline semiconductor layer, an insulating layer formed around a region where the amorphous semiconductor layer is formed on the crystalline semiconductor layer, and a collecting electrode formed on the amorphous semiconductor layer. A semiconductor junction between the crystalline semiconductor layer of one conductivity type and the amorphous semiconductor layer of the other conductivity type is formed below the collecting electrode.

Therefore, the semiconductor junction between the crystalline semiconductor layer of one conductivity type and the amorphous semiconductor layer of the other conductivity type is formed only below the collecting electrode, and the insulating layer is formed around the amorphous semiconductor layer, as described above. Specifically, the amorphous semiconductor layer of the other conductivity type is formed not uniformly but only on portions of the crystalline semiconductor layer below the collecting electrode. Consequently, the photo-generated carriers need not move over a long distance in the amorphous semiconductor layer having relatively high electrical resistance, thereby reducing the loss at the interface of the crystalline semiconductor layer and the amorphous semiconductor layer.

In comparison, when the amorphous semiconductor layer is formed on the crystalline semiconductor layer in the conventional manner, a portion of the amorphous semiconductor layer, the thickness of which portion corresponds to several atoms from a surface in contact with the crystalline semiconductor layer, becomes a semiconductor layer having a crystalline structure due to the influence of the crystalline structure of the underlying crystalline semiconductor layer. The semiconductor layer having the crystalline structure is mainly in a polycrystalline granular state. Consequently, the photo-generated carriers recombine with each other in the grain boundaries, so that the carriers cannot be effectively collected.

On the other hand, in the present invention, the amorphous semiconductor layer is formed only on portions of crystalline semiconductor layer, thereby reducing the generation of portion polycrystalline grains. In addition, a portion of the amorphous semiconductor layer, which portion is close to the interface of the amorphous semiconductor layer and the crystalline semiconductor layer, is a more epitaxial film, thereby forming a heterojunction in which the height of the energy barrier at the interface is decreased.

Furthermore, when film formation is further continued on the above described more epitaxial film portion, so that the amorphous semiconductor layer which is not affected by the underlying crystalline semiconductor layer is gradually formed, the band structure is continuously enlarged. Accordingly, the interfacial states and the energy barrier at the heterojunction interface can be reduced, thereby reducing the recombination of the generated carriers.

According to the present invention, the junction interface of the crystalline semiconductor layer and the amorphous semiconductor layer is formed only below the portions where the collecting electrode is formed. Consequently, the number of grains in the vicinity of the interface of the crystalline semiconductor layer and the amorphous semiconductor layer is decreased, and the band structure or band gap in the amorphous semiconductor layer is continuously increased, thereby making it possible to reduce the interfacial states and the energy barrier at the interface. Moreover, the amorphous semiconductor layer having relatively high electrical resistance exists only below the collecting electrode, so that the resistance loss at the interface of the amorphous semiconductor layer and the crystalline semiconductor layer is reduced. Accordingly, a solar cell having high conversion efficiency can be achieved.

Furthermore, in accordance with a particular aspect of the present invention, an intrinsic amorphous semiconductor layer is interposed between the crystalline semiconductor layer of one conductivity type and the amorphous semiconductor layer of the other conductivity type. In this case, the interfacial states particularly due to impurities in the vicinity of the junction interface can be reduced, as compared with the case in which the crystalline semiconductor layer of one conductivity type and the amorphous semiconductor layer of the other conductivity type are directly brought into contact with each other to form a semiconductor junction, thereby further reducing the recombination of the photo-generated carriers.

In accordance with another aspect of the present invention, a photovoltaic device comprises a crystalline semiconductor layer of one conductivity type having at least one groove formed on its surface, an amorphous semiconductor layer of the other conductivity type formed in contact with the crystalline semiconductor layer directly or indirectly in the groove, an insulating layer formed on the surface of the crystalline semiconductor layer around the groove, and a collecting electrode formed on the amorphous semiconductor layer. A semiconductor junction between the crystalline semiconductor layer and the amorphous semiconductor layer is formed below the collecting electrode.

In this case, the amorphous semiconductor layer of the other conductivity type is formed in the groove formed in the crystalline semiconductor layer of one conductivity type. The crystalline semiconductor layer of one conductivity type and the amorphous semiconductor layer of the other conductivity type form the junction only below the collecting electrode, thereby reducing resistance loss at the junction interface and reducing the recombination of photo-generated carriers.

The amorphous semiconductor layer is thus formed in the groove in the crystalline silicon substrate to form the semiconductor junction, thereby not only effectively reducing the recombination of the photo-generated carriers and reducing the resistance loss in the junction interface but also reducing the resistance loss in the electrode because it is easy to increase the thickness of the collecting electrode. Accordingly, a solar cell having higher conversion efficiency can be achieved.

Furthermore, in accordance with a particular aspect of the above described other aspect of the present invention, in the above described photovoltaic device, an intrinsic amorphous semiconductor layer is interposed between the crystalline semiconductor layer of one conductivity type and the amorphous semiconductor layer of the other conductivity type disposed in the above described groove, thereby further preventing the recombination of the photo-generated carriers.

Additionally, as described in the foregoing, in the photovoltaic device according to the present invention, the insulating layer is formed around portions where the semiconductor junction is formed. Thus, a transparent electrode commonly used in photovoltaic devices is formed on the insulating layer and the collecting electrode, an MIS structure is formed comprising the transparent electrode (a metal), the insulating layer, and the crystalline semiconductor layer. As a result, an energy band structure such that electrons and holes are separated from each other is formed by the MIS structure in which the insulating layer is disposed in the interface of the metal and the crystalline semiconductor layer. Consequently, it is possible to prevent the recombination of the photogenerated carriers in the vicinity of the interface more effectively.

The foregoing and other objects, features, aspects, and advantages of the present invention will become more apparent from the following detailed description of the present invention when taken in conjunction with the accompanying drawings.

BRIEF DESCRIPTION OF THE DRAWINGS

FIGS. 2A to 2D are cross sectional views for respectively explaining the further steps of fabricating the photovoltaic device according to the first embodiment;

DESCRIPTION OF THE PREFERRED EMBODIMENTS

The present invention will become apparent from the following description of non-restrictive examples of embodiments of the present invention with reference to the drawings.

First Embodiment

Figure 3:
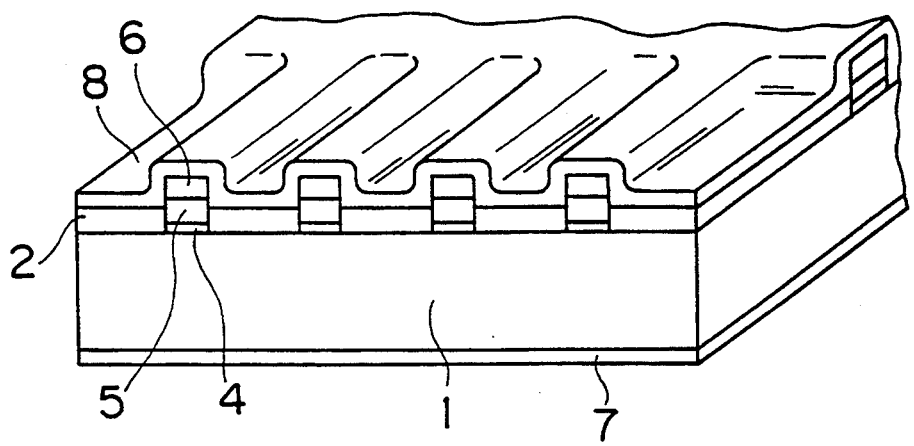
FIG. 3 is a partially cutaway perspective view showing the photovoltaic device according to the first embodiment.

Referring to FIGS. 1 to 3, a method of fabricating a photovoltaic device according to a first embodiment of the present invention will be described to clarify the construction of the photovoltaic device.

Figure 1A:
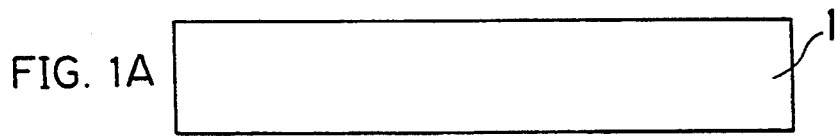
FIGS. 1A to 1D are cross sectional views for respectively explaining the steps of fabricating a photovoltaic device according to a first embodiment of the invention.

As shown in FIG. 1A, an n-type crystalline silicon substrate 1 serving, as a crystalline semiconductor layer is first prepared. The crystalline silicon substrate 1 may be either a single-crystalline silicon substrate or a polycrystalline silicon substrate.

Figure 1B:
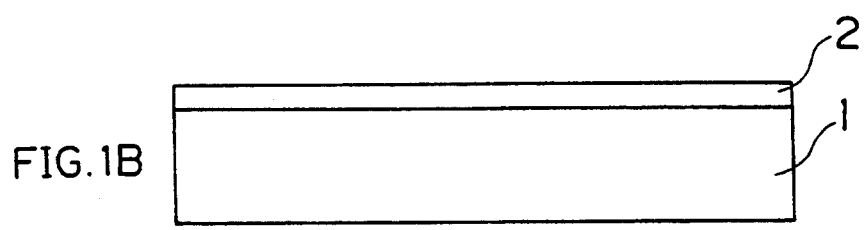

As shown in FIG. 1B, an insulating layer 2 is then formed on the above described crystalline silicon substrate 1. The insulating layer 2 can be composed of an insulating material such as $SiO_2$ or $SiN_x$. The insulating layer 2 can be formed using an arbitrarily chosen method such as a thermal oxidation method, a plasma CVD (chemical vapor deposition) method, or a thermal CVD method.

Figure 1C:
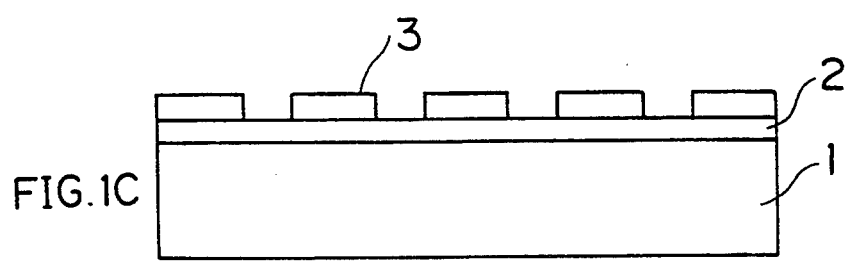
Figure 1D:
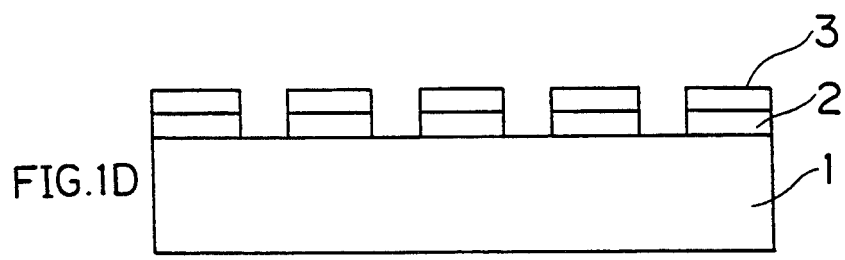

As shown in FIG. 1C, a resist 3 is then applied to the upper surface of the insulating layer 2, and then patterned. The insulating layer 2 is etched using the pattern resist 3 as a mask, whereby partially exposing the surface of the crystalline silicon substrate 1 (see FIG. 1D).

As shown in FIG. 2A, an i-type amorphous silicon thin film 4 is formed using a thin film forming method such as the plasma CVD method. Because the i-type amorphous silicon thin film 4 is formed on a crystalline silicon substrate 1, which influences the adjacent amorphous film, a silicon layer having a crystalline structure is formed in the vicinity of the interface of the i-type amorphous silicon thin film 4 and the crystalline silicon substrate 1. Thus, an i-type amorphous silicon layer which gradually becomes amorphous is formed on the silicon layer having the crystalline structure. Consequently, the band gap in the vicinity of the interface is continuously enlarged by the formation of the above described i-type amorphous silicon thin film 4.

A p-type amorphous silicon thin film 5 is then formed on the i-type amorphous silicon thin film 4 using the plasma CVD method. The p-type amorphous silicon thin film 5 may be directly formed using the plasma CVD method, or may be formed by doping with boron (B) after forming the i-type amorphous silicon thin film to a certain thickness.

A collecting electrode 6 is formed on the p-type silicon thin film 5 using an electrode forming technique such as evaporation. Thereafter the resist 3 is lifted off except at the portions where the i-type amorphous silicon thin film 4 and the p-type amorphous silicon thin film 5 are formed on the crystalline silicon substrate 1, thereby exposing the insulating layer 2 around the portions where a pin junction is formed, as shown in FIG. 2B.

A back electrode 7 is then formed on the lower surface of the crystalline silicon substrate 1, thereby obtaining the photovoltaic device according to the present embodiment.

In the photovoltaic device shown in FIG. 2C, a semiconductor junction is formed only below the portions where the collecting electrode 6 is formed. Specifically, the i-type amorphous silicon thin film 4 including a silicon layer having a crystalline structure and a thickness corresponding to several atoms, is partially formed on the upper surface of the crystalline silicon substrate 1, while being influenced by the underlying crystal structure of the substrate 1, so that the generation of grains is reduced, the recombination at the grain boundaries is reduced, and the band gap is continuously enlarged in the i-type amorphous silicon thin film 4, thereby reducing interfacial states and energy barriers in the interface.

Moreover, the amorphous silicon thin film 4 having relatively high electrical resistance is brought into contact with only part of the crystalline silicon substrate 1, so that the loss at the interface of the crystalline silicon substrate 1 and the amorphous silicon thin film 4 in collecting current in the collecting electrode 6 is also reduced.

FIG. 3 is a partially cutaway perspective view showing the photovoltaic device shown in FIG. 2D. In the photovoltaic device according to the present embodiment, if a transparent electrode 8 is so formed as to cover the surfaces of the insulating layer 2 and the collecting electrode 6, not only the insulating layer 2 but also the transparent electrode 8 functions as an anti-reflection film. In addition, the transparent electrode 8 is generally composed of ITO (indium tin oxide) or tin oxide, so that a laminated structure of the transparent electrode 8 (a metal), the insulating layer 2, and the crystalline silicon substrate 1 (a semiconductor) is formed in a portion where the insulating layer 2 is formed. Consequently, it is possible to prevent recombination of photo-generated carriers more effectively due to the effect produced by the above described MIS structure.

The current I-voltage V characteristics of the photovoltaic device according to the above described embodiment shown in FIG. 2C were measured. The results are indicated by the solid line A in FIG. 4. For comparison, a conventional example was fabricated as a corresponding photovoltaic device in which an i-type amorphous silicon thin film and a p-type amorphous thin film are laminated in this order on the whole surface of a crystalline silicon substrate 1, and a collecting electrode is formed on portions thereof. The current I-voltage V characteristics thereof were similarly measured, to obtain the results indicated by the broken line B in FIG. 4.

Figure 4:
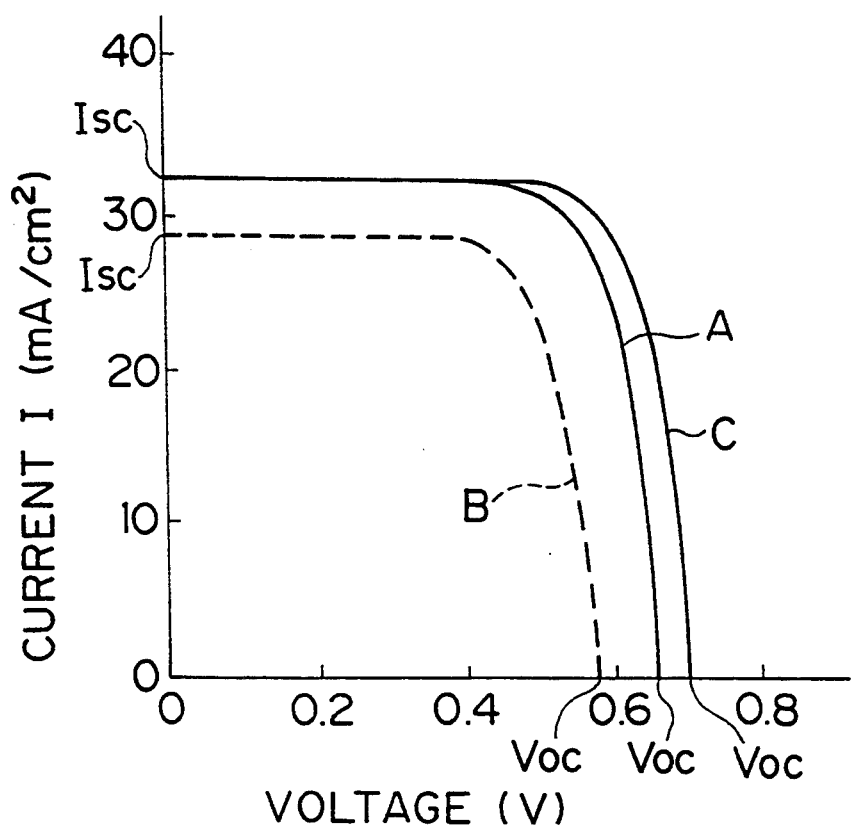
FIG. 4 is a diagram showing current-voltage characteristics of the photovoltaic device according to the first embodiment and of conventional photovoltaic device.

As can be seen from FIG. 4, in the photovoltaic device according to the present embodiment, both the short-circuit current Isc and the open-circuit voltage Voc are increased, as compared with those by the above described conventional example.

Furthermore, measurements were similarly made of the current-voltage characteristics of the photovoltaic device including the transparent electrode 8 as shown in FIGS. 2D and 3, to obtain the results indicated by solid line C in FIG. 4. As apparent from FIG. 4, it is confirmed that the open-circuit voltage is further raised and consequently, carrier recombination is more effectively reduced or prevented due to the effect produced by the above described MIS structure by forming the transparent electrode 8.

Second Embodiment

Figure 6A:
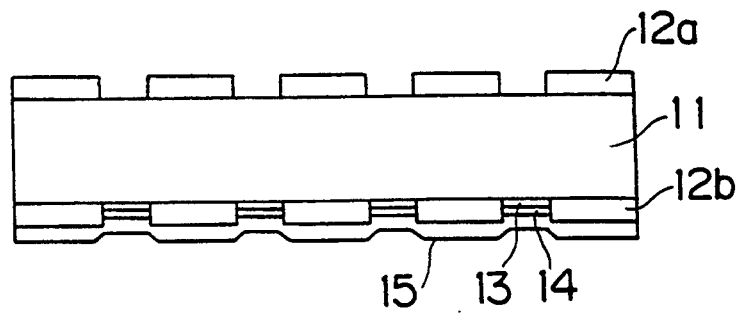
FIGS. 6A to 6D are cross sectional views for respectively explaining the further steps of fabricating the photovoltaic device according to the second embodiment.
Figure 6B:
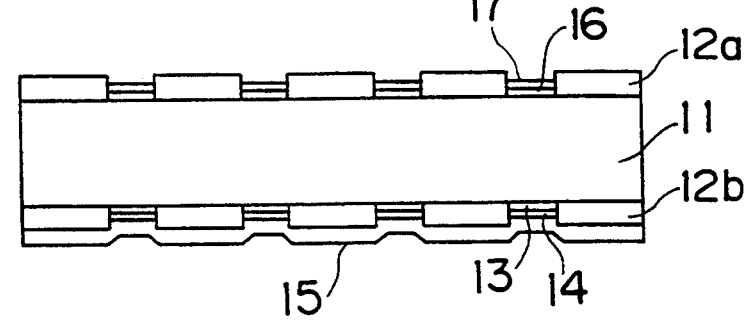
Figure 6C:
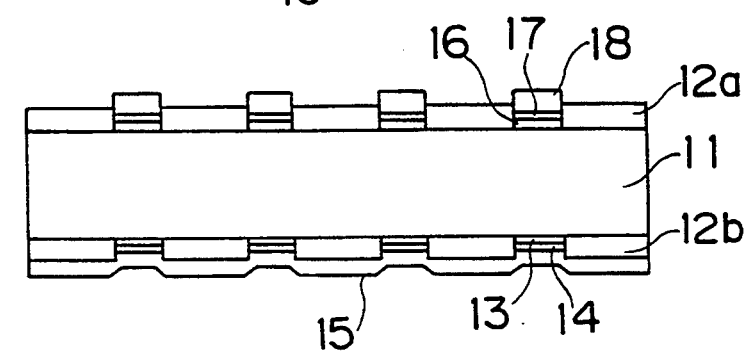
Figure 6D:
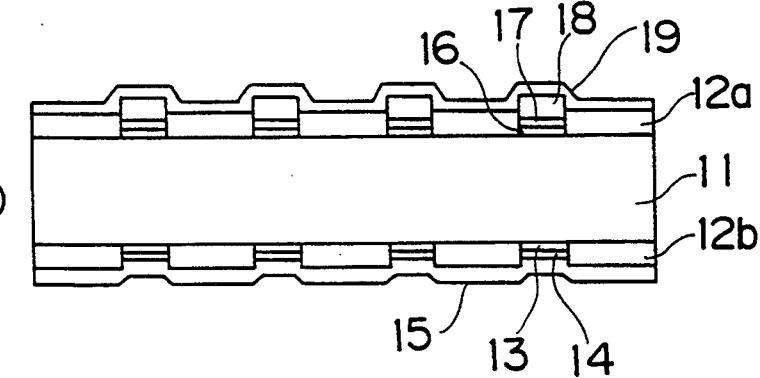
Figure 7:
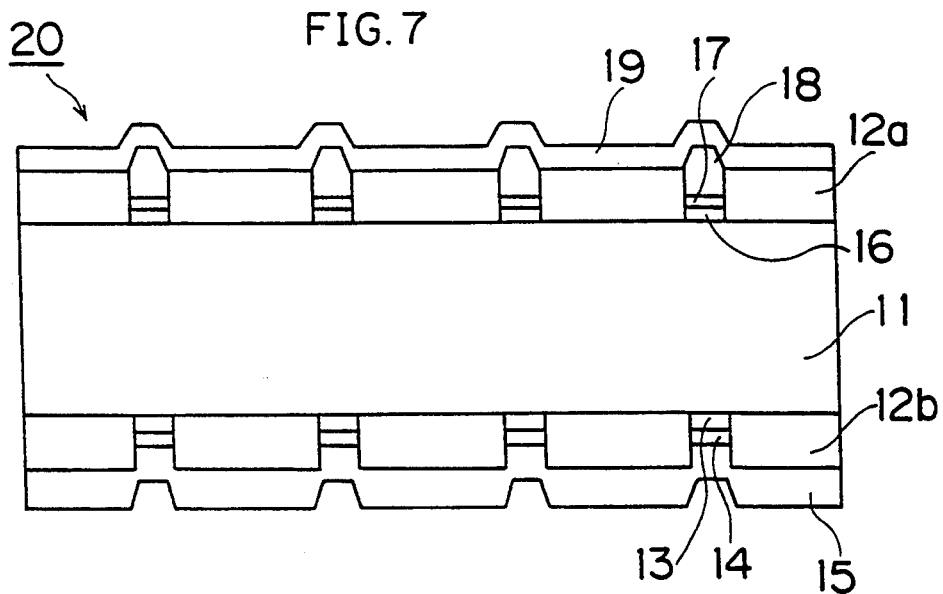
FIG. 7 is a cross sectional view for explaining the construction of the photovoltaic device according to the second embodiment.

Referring to FIGS. 5 to 7, the fabricating method and the construction of a photovoltaic device according to a second embodiment of the invention will now be described.

Figure 5A:
FIGS. 5A to 5E are cross sectional views for respectively explaining the steps of fabricating a photovoltaic device according to a second embodiment of the invention.
Figure 5B:
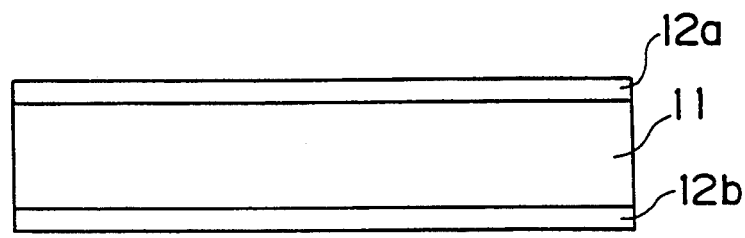
Figure 5C:
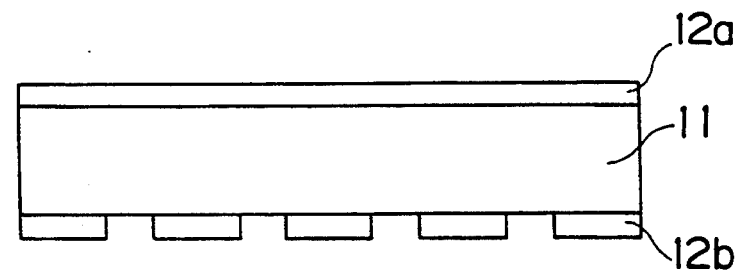
Figure 5D:
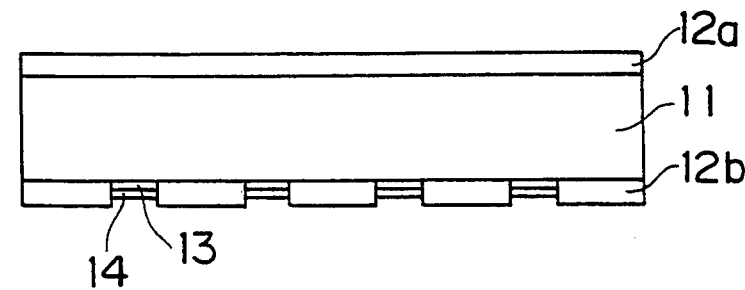

As shown in FIG. 5A, an n-type single-crystalline or polycrystalline silicon substrate 11 is first prepared. Insulating layers 12a and 12b are then formed on both major surfaces of the crystalline silicon substrate 11 using the same material and the same method as in the first embodiment (see FIG. 5B).

The insulating layer 12b on the lower surface of the crystalline silicon substrate 11 is then etched using a mask, thereby to partially exposing the lower surface of the crystalline silicon substrate 11 (see FIG. 5C):

An i-type amorphous silicon thin film 13 and an n-type amorphous silicon thin film 14 are formed on the exposed lower surface of the amorphous silicon substrate 11 using a method such as a photo-CVD method. The amorphous silicon thin films 13 and 14 may be formed using a method wherein the i-type amorphous silicon thin film 13 is formed to a certain thickness and then, doping phosphorus (P) to form the outer layer or portion of the i-type amorphous silicon thin film 13 as the n-type amorphous silicon thin film 14.

Figure 5E:
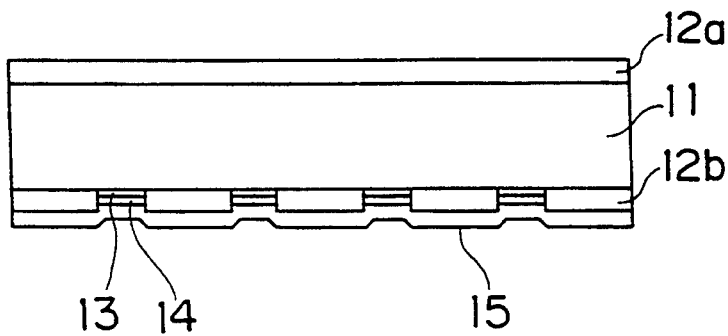

As shown in FIG. 5E, a back electrode 15 is then formed so as to cover the whole lower surface of the crystalline silicon substrate 11. The back electrode 15 can be formed by applying a suitable conductive material using a known electrode forming technique such as evaporation or sputtering.

As shown in FIG. 6A, the insulating layer 12a is then etched on the side of the upper surface of the crystalline silicon substrate 11, similarly to the insulating layer 12b on the side of the lower surface thereof, thereby partially exposing the upper surface of the crystalline silicon substrate 11.

Thereafter, an i-type amorphous silicon thin film 16 and a p-type amorphous silicon layer 17 are formed on the upper surface of the crystalline silicon substrate 11, as in the first embodiment (see FIG. 6B).

Furthermore, a collecting electrode 18 is formed on the upper surface of the p-type amorphous silicon thin film 17.

As shown in FIG. 6D, a transparent electrode 19 composed of ITO and tin oxide is then formed so as to cover the whole upper surface of the crystalline silicon substrate 11. Consequently, it is possible to obtain a photovoltaic device 20 according to the second embodiment, as shown in an enlarged manner in FIG. 7.

The photovoltaic device 20 according to the second embodiment has a similar structure as the first embodiment on the side of the upper surface of the crystalline silicon substrate 11. Consequently, the same effect as that in the first embodiment is produced on the side of the upper surface of the crystalline silicon substrate 11, that is, with a portion where a pin junction is formed and a portion where an MIS structure including the insulating layer 12a is formed.

Furthermore, in the second embodiment, a heterojunction structure which differs in crystallinity is also formed on a part of the lower surface of the crystalline silicon substrate 11, thereby effectively preventing the recombination of photo-generated carriers on the side of the lower surface. In addition, recombination of the photo-generated carriers is effectively reduced or prevented due to the effect produced by an MIS structure in a portion where the insulating layer 12b is formed, as on the side of the upper surface. Consequently, it is possible to provide a solar cell which is much superior in conversion efficiency to that in the first embodiment.

Although in the first and second embodiments, the p-type amorphous silicon thin films 5 and 17 are respectively formed on the upper surfaces of the n-type crystalline silicon substrates 1 and 11 with the i-type amorphous silicon thin films 4 and 16 being interposed therebetween to form the pin junctions, it is not necessary to provide the i-type amorphous silicon thin film in the semiconductor junction interface in the present invention.

Figure 8:
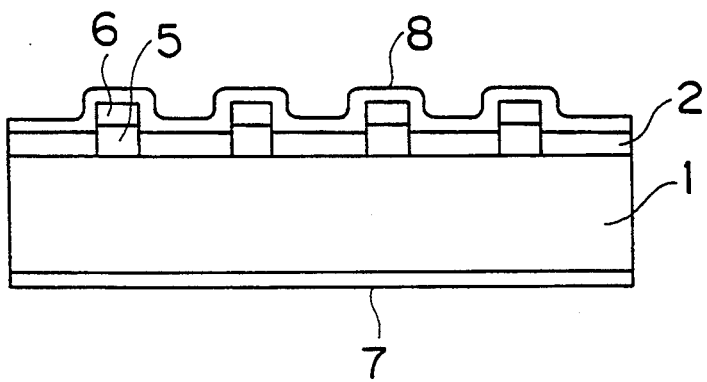
FIG. 8 is a cross sectional view showing a modified example of the first embodiment, which illustrates a photovoltaic device having a structure not including an intrinsic semiconductor layer.

For example, in a modified example of the first embodiment shown in FIG. 8, a p-type amorphous silicon thin film 5 may be formed on portions of the upper surface of a crystalline silicon substrate 1, that is, the i-type amorphous silicon thin film in the first embodiment may be omitted. Also in this case, the p-type amorphous silicon thin film 5 includes a layer with a thickness corresponding to several atoms on the side of the crystalline silicon substrate 1 which layer has a crystalline structure due to the influence of the crystalline structure of the crystalline silicon substrate 1. However, the p-type amorphous silicon thin film 5 is formed only on part of the upper surface of the crystalline silicon substrate 1, thereby reducing interfacial states and energy barriers by decreasing the amount of grains as in the first embodiment. Moreover, also in this example, the insulating layer 2 not only is formed around portions where a pn junction is formed to function as an antireflection film, but also constitutes, along with a transparent electrode 8 formed thereon and the underlying crystalline silicon substrate 1, an MIS structure, thereby effectively reducing recombination of the photo-generated carriers.

Although in the first and second embodiments, the crystalline silicon substrates 1 and 11 and the amorphous silicon thin film 14 are of an n type and the amorphous silicon thin films 5 and 17 are of a p type, they may be respectively of opposite conductivity types.

Figure 9:
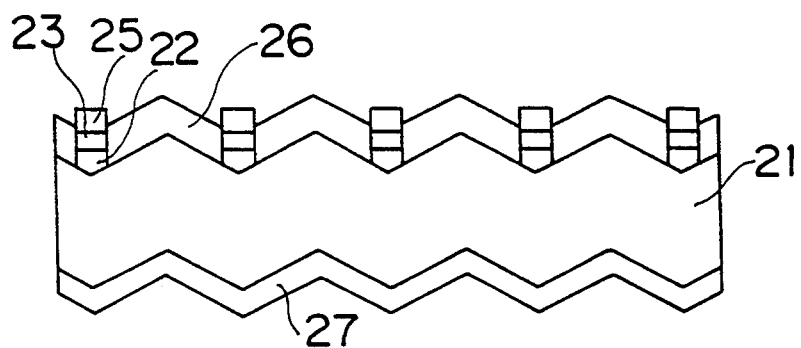
FIG. 9 is a cross sectional view showing a photovoltaic device using a crystalline silicon substrate having a texture.

Furthermore, the photovoltaic device according to the present invention may be constructed using a crystalline silicon substrate 21 the surface of which is textured as shown in FIG. 9. In the construction shown in FIG. 9, an i-type silicon thin film 22, a p-type amorphous silicon thin film 23 and a collecting electrode 25 are laminated on portions of the upper surface of the crystalline silicon textured substrate 21, particularly in the recessed portions thereof, and an insulating layer 26 is formed around the portions where a pin junction is formed. Reference numeral 27 denotes a back electrode. Consequently, it is possible not only to effectively reduce the recombination of photo-generated carriers as in the first embodiment but also to effectively improve the short-circuit current because the crystalline silicon substrate 21 is textured.

Additionally, although in the above described first and second embodiments, the crystalline silicon substrates 1 and 11 are used, the crystalline silicon substrates may be replaced with a thin film of crystalline silicon formed on a low-cost metal or glass substrate.

Third Embodiment

Figure 10:
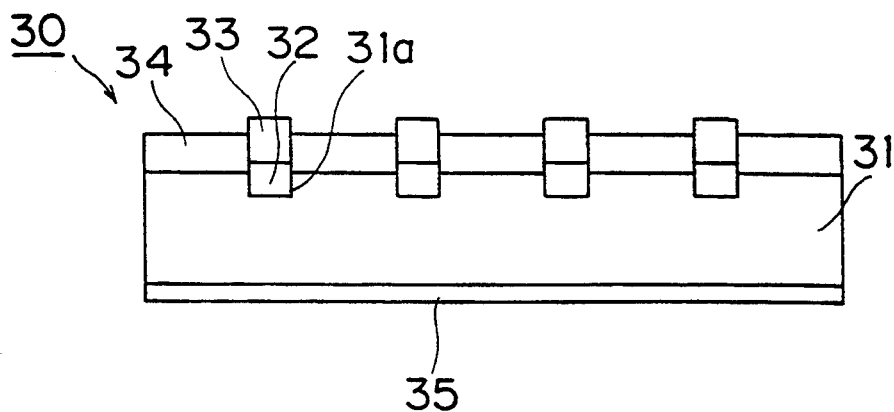
FIG. 10 is a cross sectional view for explaining a photovoltaic device according to a third embodiment of the invention.

FIG. 10 is a schematic cross sectional view showing the main parts of a photovoltaic device 30 according to a third embodiment. In the photovoltaic device 30, a plurality of grooves 31a are formed in the upper surface of an n-type or p-type crystalline silicon substrate 31. A p-type or n-type amorphous silicon thin film 32 is formed in the groove 31a. A collecting electrode 33 is formed on the amorphous silicon thin film 32. An insulating layer 34 is formed around the portions where a pn junction is formed, as in the first and second embodiments. Reference numeral 35 denotes a back electrode.

As is apparent from the third embodiment, rather than being formed on the upper surface of the crystalline silicon substrate 31, the pn junction may be formed within the crystalline silicon substrate 31.

The groove 31a and the insulating layer 34 can be easily formed by the following processes. Specifically, the insulating layer 34 is formed on the whole upper surface of the crystalline silicon substrate 31 and is then patterned. Then, the crystalline silicon substrate 31 is etched, thereby exposing the surface of the crystalline silicon substrate 31 as well as forming the grooves 31a by increasing the etching strength.

In the third embodiment, the pn junction is formed in the silicon substrate 31, thereby making it easy to increase the thickness of the collecting electrode 33. Consequently, it is possible to reduce the resistance loss in the electrode portion.

Figure 11:
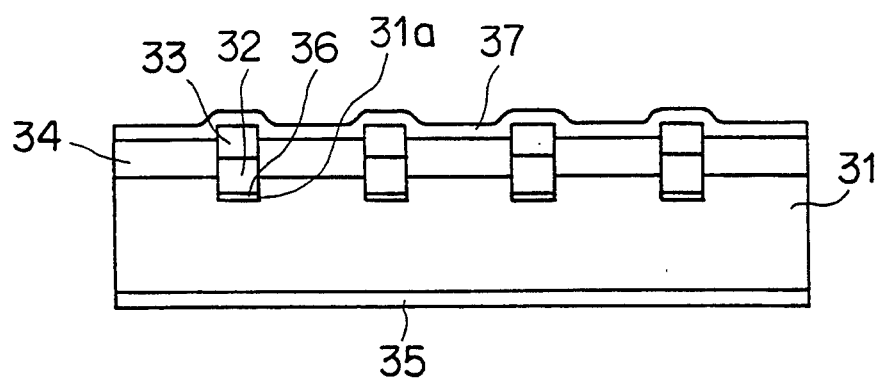
FIG. 11 is a cross sectional view for explaining a modified example of the third embodiment.

Also in the third embodiment, an i-type amorphous silicon thin film 36 may be disposed in the heterojunction interface, as shown in FIG. 11. Furthermore, in FIG. 11, a transparent electrode 37 is formed over the insulating layer 34, as in the first and second embodiments, thereby further preventing the recombination of photo-generated carriers due to the MIS effect.

Although in the first to third embodiments, the description involved an example using silicon as the semiconductor material, the photovoltaic device according to the present invention can be constructed using another semiconductor material such as Ge or a Ga-As alloy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising: a crystalline semiconductor layer of one conductivity type having a first surface and a second surface; an amorphous semiconductor layer of the other conductivity type arranged directly or indirectly on a first region of said first surface of said crystalline semiconductor layer; an insulating layer arranged on a second region of said first surface of said crystalline semiconductors layer around said first region; a collecting electrode arranged on said amorphous semiconductor layer; and a transparent electrode covering said insulating layer and said collecting electrode; wherein a semiconductor junction between said crystalline semiconductor layer and said amorphous semiconductor layer is formed below said collecting electrode.

2. The photovoltaic device according to claim 1, wherein said transparent electrode and said insulating layer and said crystalline semiconductor layer together form an MIS structure at said second region, parallel to said semiconductor junction, which is formed at said first region.

3. The photovoltaic device according to claim 1, wherein at least one of said first and second surfaces of said crystalline semiconductor layer has a texture.

4. The photovoltaic device according to claim 3, wherein said first region corresponds with a recess portion of said texture of said crystalline semiconductor layer.

5. The photovoltaic device according to claim 1, further comprising an intrinsic amorphous semiconductor layer arranged between said amorphous semiconductor layer of the other conductivity type and said crystalline semiconductor layer of one conductivity type.

6. The photovoltaic device according to claim 5, wherein at least one of said first and second surfaces of said crystalline semiconductor layer has a texture.

7. The photovoltaic device according to claim 6, wherein said first region corresponds with a recess portion of said texture of said crystalline semiconductor layer.

8. The photovoltaic device according to claim 1, further comprising a second amorphous semiconductor layer of the one conductivity type arranged directly or indirectly on a third region of said second surface of said crystalline semiconductor layer, a second insulating layer arranged on a fourth region of said second surface around said third region, and a back electrode covering said second insulating layer and said second amorphous semiconductor layer.

9. The photovoltaic device according to claim 8, further comprising a second intrinsic amorphous semiconductor layer arranged between said second amorphous semiconductor layer of the one conductivity type and said crystalline semiconductor layer.

10. A photovoltaic device comprising: a crystalline semiconductor layer of one conductivity type having a surface with at least one groove formed therein; an amorphous semiconductor layer of the other conductivity type arranged in contact with said crystalline semiconductor layer in said groove; an insulating layer arranged on said surface of said crystalline semiconductor layer around said groove; and a collecting electrode formed on said amorphous semiconductor layer; wherein a semiconductor junction between said crystalline semiconductor layer and said amorphous semiconductor layer is formed below said collecting electrode.

11. The photovoltaic device according to claim 10, further comprising a transparent electrode covering said insulating layer and said collecting electrode.

12. The photovoltaic device according to claim 10, further comprising an intrinsic amorphous semiconductor layer arranged between said amorphous semiconductor layer of the other conductivity type and said crystalline semiconductor layer.

13. The photovoltaic device according to claim 12, further comprising a transparent electrode covering said insulating layer and said collecting electrode.

* * * * *